United States Patent [19]

Vincze

[11] Patent Number: 4,878,030
[45] Date of Patent: Oct. 31, 1989

[54] LINEARIZER FOR MICROWAVE AMPLIFIER

[75] Inventor: Arpad D. Vincze, Los Altos, Calif.

[73] Assignee: Ford Aerospace & Communications Corporation, Newport Beach, Calif.

[21] Appl. No.: 112,852

[22] Filed: Oct. 23, 1987

[51] Int. Cl.⁴ .............................. H03F 1/30; H03F 3/58
[52] U.S. Cl. ........................................ 330/149; 330/43
[58] Field of Search ............ 330/149, 43, 295, 124 R, 330/284

[56] References Cited

U.S. PATENT DOCUMENTS

| | | |
|---|---|---|
| 4,068,186 | 1/1978 | Sato et al. |
| 4,122,399 | 10/1978 | Heiter et al. |
| 4,283,684 | 8/1981 | Satoh |
| 4,291,277 | 9/1981 | Davis et al. |
| 4,329,655 | 5/1982 | Nojima et al. |
| 4,453,133 | 6/1984 | Travis |
| 4,465,980 | 8/1984 | Huang et al. |
| 4,529,945 | 7/1985 | Heynisch |
| 4,532,477 | 7/1985 | Green, Jr. et al. |
| 4,554,514 | 11/1985 | Whartenby et al. |
| 4,564,816 | 1/1986 | Kumar et al. |

Primary Examiner—Gene Wan
Attorney, Agent, or Firm—Kenneth R. Allen; Edward J. Radlo; Keith L. Zerschling

[57] ABSTRACT

A microwave signal linearizer for a travelling wave tube amplifier (TWTA) provides for simple and flexible adjustment of a predistortion network suitable for independently compensating for a wide range of travelling wave tube amplifier-induced distortions. The linearizer or predistortion network is formed by three divided parallel passive microwave signal channels, the first channel having a coaxial microwave limiter diode network, the second channel having a variable attenuator for adjusting amplitude modulation (AM/AM) non-linearity, and a third channel for adjusting amplitude modulation to phase modulation (AM/PM) non-linearity. Signals directed to the first and second channels are combined in a 180° hybrid network to produce a difference signal which is directed through a difference channel to a 90° hybrid network. The signals through the third channel are directed to the 90° hybrid network where the difference channel and the third channel are combined and directed to an output channel for providing drive signal to a power amplifier, i.e., a travelling wave tube.

6 Claims, 3 Drawing Sheets

LINEARIZER FOR MICROWAVE AMPLIFIER

BACKGROUND OF THE INVENTION

This invention relates to microwave travelling wave tube amplifiers (TWTAs) and more particularly, it relates to a linearizer for super high frequency (SHF) travelling wave tube amplifiers for use in the uplink of a ground terminal.

Distortion compensation techniques are necessary to reduce amplifier-produced distortion, such as amplitude modulation to phase modulation conversion (AM/PM) and amplitude modulation to amplitude modulation conversion (AM/AM), in the transfer characteristics of amplifiers, and in particular wideband amplifiers operating at frequencies where band-limiting feedback techniques are not suitable. Accordingly, it is desirable to provide a predistortion network, or linearizer, which does not substantially reduce the available bandwidth of a microwave amplifier such as a travelling wave tube amplifier.

Various predistortion compensation techniques have been employed in order to improve operation of broadband amplifiers. In the past, feedforward and feedback arrangements have been suggested in order to duplicate and compensate generally for nonlinear transfer characteristics of travelling wave tube amplifiers. It has been found, however, that such generalized techniques are not suited under conditions requiring use of the broadest possible bandwidth. Moreover, each travelling wave tube amplifier (TWTA) has a frequency dependent characteristic which cannot be generalized. Therefore, what is needed is a linearizer circuit which is readily adjustable, that is trimmed, to the precise characteristics of the TWTA with which it is intended to be used. Moreover, it is desirable, and by this invention as hereafter explained, possible to compensate for the TWTA saturation characteristics at the desired band center without compromising performance of the TWTA at the band edges.

The following patents were uncovered in a search of the prior art in respect to the subject invention:

Travis, U.S. Pat. No. 4,453,133 issued June 5, 1984, for "Active Predistorter for Linearity Compensation". This invention employs predistortion components in connection with a wideband amplifier. In this particular implementation, it is believed that the circuit would be impractical to develop an active microwave device which matches the characteristics of the device to be compensated and further, no provision is made for AM/PM compensation.

Whartenby and Kumar, U.S. Pat. No. 4,553,514, describes an active predistortion circuit which makes it feedback schemes at microwave frequencies, which are sometimes desirable, virtually impossible to implement. Moreover, no provision is made for independent AM/AM and AM/PM compensation, and no provision is made to address preexisting amplitude and phase non-linearities.

Kumar and Whartenby, U.S. Pat. No. 4,564,816, describes a further active predistortion circuit. As with other active device-based realization, it is less likely to be reliable and accurate under all operating conditions and temperatures. Moreover, no provision is made for independent AM/AM and AM/PM compensation, and no provision is made to address preexisting amplitude and phase non-linearities.

Green, Jr., et al., U.S. Pat. No. 4,532,477, describes a still further active predistortion amplifier which likewise teaches away from the use of passive predistortion and lacks independent AM/AM and AM/PM compensation.

Heynisch, U.S. Pat. No. 4,529,945, describes a method for removing distortion which also involves active elements. Again, no provision is made for independent AM/AM and AM/PM compensation. The circuit calls for use of matching predistorter diodes, a difficult and typically expensive requirement.

Huang et al., U.S. Pat. No. 4,465,980, is a mixed passive and active predistortion network. However, operation is geared to relatively low frequency operation. Again, no provision is made for independent AM/AM and AM/PM compensation.

Nojima et al., U.S. Pat. No. 4,329,655, describes an adaptive equalization linearizer. The circuit is of limited usefulness in that it is designed to reduce noise caused by non-linearities in connection with a noise detection scheme.

Davis et al., U.S. Pat. No. 4,291,277, describes a complex digitally-controlled predistortion circuit which adapts to time-varying characteristics of a high power microwave amplifier. Such a system is expensive to implement and so complex that it is difficult to analyze circuit operation and predict performance.

Satoh, U.S. Pat. No. 4,283,684, describes a compensating circuit for high frequency amplifiers. The invention described is an active circuit which must be matched to the device to be linearized, it is difficult to analyze and build because it contains an asymmetrically and reactively loaded hybrid. No known analytical technique can be used to design such a circuit, so expensive cut and try techniques are required to realize such a circuit. The invention has limited use and mainly is an application of a microwave integrated circuit for use in a satellite.

Heiter et al., U.S. Pat. No. 4,122,399, describes a distortion generator. The predistortion elements are reactive, so large signal effects may cause significant bias offsets and instabilities. Coupled mismatches may also cause parametric oscillations and generate excessive harmonic content, and thus may be self-defeating as an addition to an amplifier circuit.

Sato et al., U.S. Pat. No. 4,068,186, describes a passive predistortion network. The circuit has an asymmetrically and reactively loaded hybrid. Implementation based on analytic models is difficult and may require costly cut-and-try methods of realization. The adjustment capabilities are inadequate, since there is no independent control of AM/AM and AM/PM characteristics. The circuit is better suited for a relatively narrower bandwidth is contemplated for the present invention.

SUMMARY OF THE INVENTION

According to the invention, a linearizer is provided for a travelling wave tube amplifier (TWTA) which provides for simple and flexible adjustment of a predistortion network suitable for independent compensating for a wide range of travelling wave tube amplifier-induced distortions. Specifically, the invention comprises a predistortion network formed by three parallel passive channels, the first channel having a coaxial microwave limiter diode network, the second channel having a variable attenuator for adjusting amplitude modulation (AM/AM) non-linearity, and a third channel for adjusting amplitude modulation to phase modulation (AM/PM) non-linearity. Signals directed to the first and second channels are combined in a 180° hybrid network to produce a difference signal which is directed through a difference channel to a 90° hybrid network. The signals through the third channel are directed to the 90° hybrid network where the difference channel and the third channel are combined and directed to an output channel for providing drive signal to a power amplifier, i.e., a travelling wave tube.

The invention will be better understood by reference to the following detailed description in connection with the accompanying drawings.

DESCRIPTION OF SPECIFIC EMBODIMENTS

Figure 1:
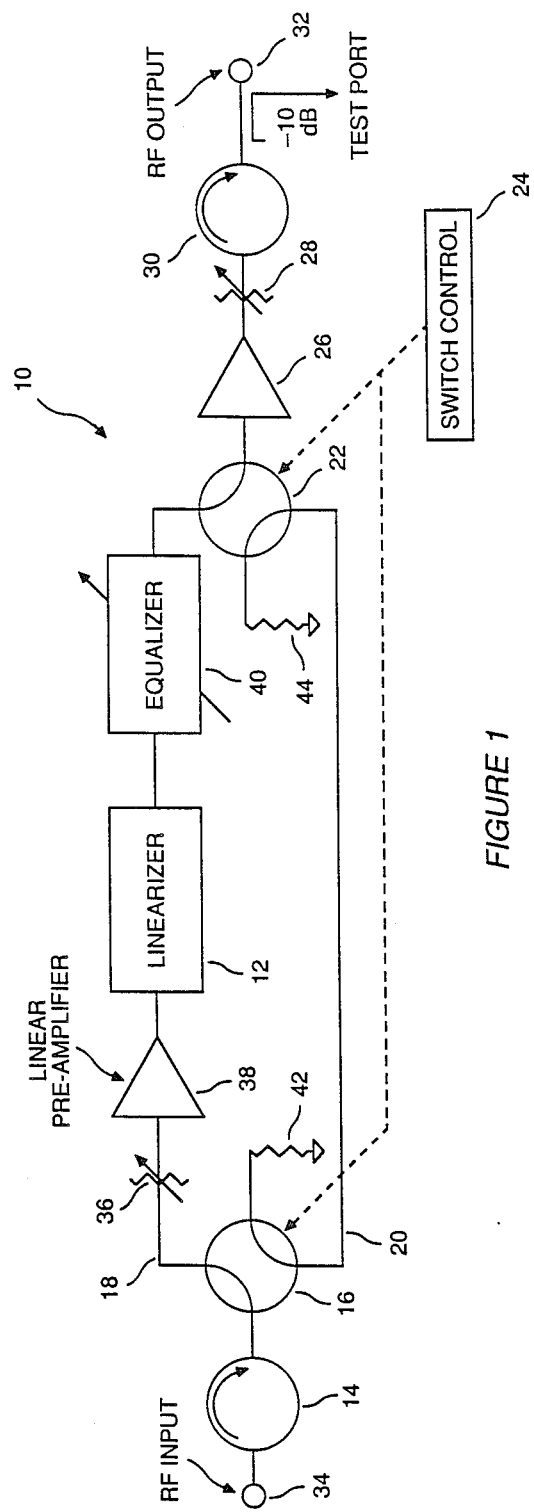
FIG. 1 is a block diagram of a circuit showing an application of a linearizer in accordance with the invention.

Referring to FIG. 1, there is shown one example of a travelling wave tube driver network 10 employing a predistortion network or linearizer 12 in accordance with the invention. The driver driver 10 has at its input a first isolator 14 coupled through a first bypass switch 16 which directs a signal selectively either through a predistortion channel 18 or a bypass channel 20. Signals directed through the bypass channel 20 are directed through a second bypass switch 22 which is controlled by a ganged switch control 24 which also controls the first bypass switch 16. Bypass signals through bypass channel 20 are thereby normally directed without predistortion or linearization to an amplifier 26 which comprises the final driver for a travelling wave tube (not shown), whose input is via the output port 32, or more specifically through an output power attenuator or power adjustment means 28 through a second isolator 30 to an RF output port 32.

When the amplifier driver 10 is employed with a linearizer 12, signals from the RF input port 34 are directed through the first bypass switch 16 through the predistortion channel 18 to a drive power attenuator or adjustment 36. The output of the drive power adjustment 36 is directed through a linear preamplifier 38 to the linearizer 12 in accordance with the invention. The linearizer is operative to modified the AM/AM and AM/PM characteristics of the signals in accordance with the invention, as hereinafter explained.

Output from the predistortion network 12 is provided to an equalizer 40, which provides for a single, (factory-adjustable) amplitude and phase modification in accordance with known techniques. The equalizer 40 is an optional component which is not necessary in many applications. The output of the equalizer 40 is directed through the second bypass switch 22 into the input of the linear post amplifier 26 as before. Optional first test ports 42 and 44 are provided across the first and second bypass switches 16 and 22, respectively, to provide for off-line testing of the amplifier driver 10. More specifically, the entire predistortion network channel 18 can be tested off-line under switch control. This circuit shows but one application of the the linearizer in accordance with the invention.

Figure 2:
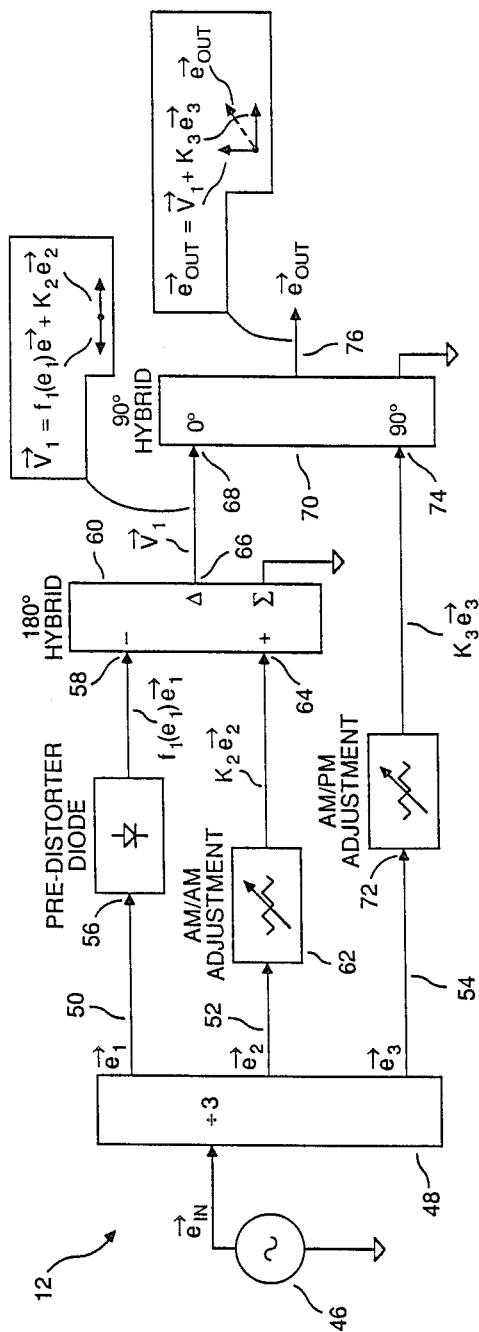
FIG. 2 is a block diagram of a linearizer in accordance with the invention.

Referring now to FIG. 2, there is shown a detailed block diagram of the predistortion network 12 in accordance with the invention. A signal input is represented by a signal source 46, as for example, the output of the linear preamplifier 38 of FIG. 1. The predistortion network 12 comprises a three-way divider 48 receiving a signal from the signal source 46 and dividing it three ways phase synchronously into three channels, namely, a predistorter channel 50 carrying a voltage signal $e_1$ (where e is a vector quantity), an amplitude modulation adjustment channel 52 (AM/AM adjustment channel 52) carrying signal $e_2$, and a phase modulation adjustment channel (AM/PM adjustment channel 54) carrying a third voltage signal $e_3$(vector).

The predistortion channel 50 directs a signal through a predistorter diode network 56. The predistorter diode network 56 is a coaxial microwave limiter diode network, such as a Hewlett-Packard Model No. 33,150A microwave bias network module coupled to a Hewlett-Packard Model No. 33,711A coaxial microwave limiter module (both manufactured by the Hewlett-Packard Microwave Semiconductor Division of San Jose, Calif.), which limits microwave signals in a nonlinear fashion in accordance with the characteristics of the selected diode network. The selected operating range of the diode, as selected by the bias on the diode network, in large measure determines the exact operating characteristics of the diode network. The output is a nonlinear function:

$$v_1 = f_1(e_1)^* e_1.$$

The output of the predistorter diode network 56 is coupled to the inverting input port 58 of a 180° hybrid network 60. The AM/AM adjustment channel 52 is directed through an AM/AM adjustment means 62, which is a microwave attenuator such as a variable resistive attenuator or a preprogrammable PIN diode attenuator. The advantage of a PIN diode attenuator is that it can be preprogrammed and remotely optimized to an optimum attenuation point in the frequency band of interest. The adjustment means 62 produces as an output a signal represented by the value $K_2 e_2$, which is directed to the non-inverting input port 64 of the 180° hybrid network 60. It is important to note that the vector is unmodified in phase by the AM/AM adjustment means 62.

The 180° hybrid network 60 combines the signals at input port 58 and input port 64 into a single vector signal $v_1$ which is the 180° differential sum of the vector signals provided to the hybrid without introduction of any phase distortion. The differential signal $v_1$ is provided at the differential output port 66 of the 180° hybrid network 60 as input to the non-inverting or 0° input port 68 of the 90° hybrid 70.

The third channel, namely, the AM/PM adjustment channel 54 which generates the vector signal $e_3$ provides a signal through an AM/PM attenuator or adjustment means 72, the output of which is a signal $K_3 e_3$ which is coupled to the 90° input port 74 of a 90° hybrid 70. The AM/PM adjustment means 72 may likewise be a microwave attenuator such as a variable resistive attenuator or a preprogrammable PIN diode attenuator.

The 90° hybrid 70 combines the signals at input port 68 and input port 74 into an output signal $e_{out}$ which is the combination or sum of the vectors at the input ports 68 and 74 according to the function:

$e_{out} = v_1 + K_3 e_3$.

Because the vectors add in quadrature, the phase of the output signal is a function of the relative amplitude of the AM/AM adjustment and the AM/PM adjustment. The signal is provided at a signal output port 76.

The linearizer 12 according to the invention operates as follows: The signals $e_1$ and $e_2$ as processed by the AM/AM adjustment means 62 and the predistortion diode 56 are subtracted from one another and then added to the phase adjusted output signal $e_3$ at a 90° vector offset to produce the output signal $e_{out}$. Adjustment of AM/AM adjustment means 62 provides amplitude adjustment to the ultimate signal. Since the signal at the 0° input port 74 of the 90° hybrid are in a 90° phase relation with the input signal at the 90° input port 68, any attenuation provided through the AM/PM adjustment means 72 has a direct effect on the phase adjustment of the output signal $e_{out}$. The AM/AM adjustment means 62 is provided to adjust the AM/AM performance for an optimum value. The AM/PM adjustment means 72 is provided to allow for adjustment to optimum AM/PM performance. The predistortion diode network 56 is preselected for the best performance which is consistent with the power amplifier non-linearity curve and power level. The diode may differ depending on the desired center frequency of the power amplifier, since the predistortion diode network 56 includes a diode which is also frequency sensitive.

Figure 3:
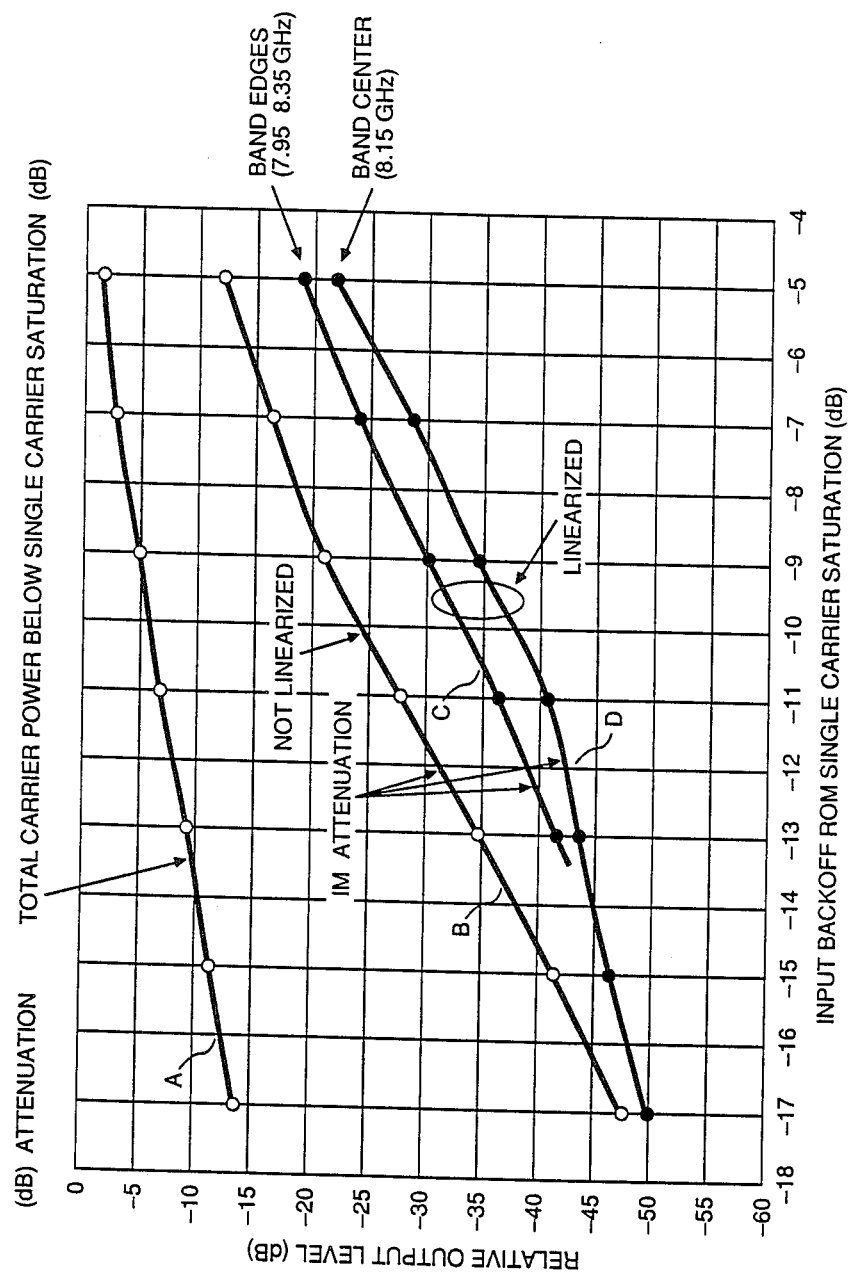
FIG. 3 is a graph showing the relative improvement of two-carrier intermodulation attenuation versus input backoff at an optimized frequency for a linearized and non-linearized travelling wave tube amplifier.

Referring to FIG. 3, there is shown a graph illustrating the relative improvement of signals with a predistortion network or linearizer in accordance with the invention as compared with a travelling wave tube amplifier without the predistortion. Curve A illustrates the total carrier power below a reference value represented by a single-carrier saturation level. Curve B shows the intermodulation attenuation of a travelling wave tube amplifier which has not been linearized. Curve C shows the intermodulation attenuation of a travelling wave tube amplifier which has been linearized in accordance with the invention, illustrating the attenuation at measured band edges with a band center at 8.15 GHz. The band edges are at least 7.95 GHz and 8.35 GHz for a passband of 400 MHz. (A broader passband is possible, i.e., 7.9 GHz to 8.4 GHz.) The improvement over the non-linearized characteristic is immediately apparent. This performance is achieved when the travelling wave tube amplifier is optimized to the band center, and this characteristic is the performance obtained without any further adjustment to the travelling wave tube amplifier at the band edges.

Curve D shows the intermodulation attenuation of a travelling wave tube amplifier which has been linearized in accordance with the invention at the band center (in this example 8.15 GHz). The improvement over the performance at the band edges as well as the dramatic improvement over the non-linearized performance of the amplifier is also immediately apparent. At a level of $-5$ dB input backoff, there is a 7 dB improvement relative to the non-linearized performance. At an input backoff of $-17$ dB, there is approximately a 2.5 dB improvement. Thus, a linearized amplifier in accordance with the invention can operate at considerably higher and therefore more efficient power levels than a non-linearized travelling wave tube amplifier.

Although it is generally considered desirable to select the diode in the predistortion network 12 by its characteristics, tests revealed that differences in diode characteristics can be compensated for by appropriate adjustment of the attenuation in the other two channels of the linearizer. As a consequence, the specification of the diode is not critical.

The invention has been explained with reference to specific embodiments. Other embodiments will be apparent to those of ordinary skill in the art. For example, the invention can be realized in a sufficiently compact package that it can be incorporated into a standalone, individual TWTA module, a configuration which is not possible with more complex systems. Therefore it is not intended that this invention be limited except as indicated by the appended claims.

I claim:

1. An apparatus for compensating for distortions in the transfer characteristics of a travelling wave tube amplifier comprising:
   a first channel;
   a second channel;
   a third channel;
   signal divider means coupled to provide a microwave signal divided phase synchronously into a first channel microwave signal to said first channel, a second channel microwave signal to said second channel and a third channel microwave signal to said third channel;
   non-linear diode means in said first channel for limiting said first channel microwave signal;
   first attenuation means in said second channel for attenuating said second channel microwave signal by a first adjustable constant;
   second attenuation means in said third channel for attenuating said third channel microwave signal by a second adjustable constant;
   first hybrid means coupled to said first channel and to said second channel for combining said first channel microwave signal and said second channel microwave signal in a 180° phase relationship to provide a differential signal on a differential signal channel; and
   second hybrid means coupled to said third channel and to said differential channel for combining said differential channel signal and said third channel microwave signal in quadrature phase, thereby to allow for substantially independent adjustment of AM/AM characteristics and AM/PM characteristics of a resultant output signal.

2. The apparatus according to claim 1 wherein said non-linear diode means in said first channel is coaxial microwave limiter diode network.

3. The apparatus according to claim 1 wherein said AM/AM adjustment means is a preprogrammable PIN diode attenuator.

4. The apparatus according to claim 1 wherein said AM/AM adjustment means is a variable resistive attenuator.

5. The apparatus according to claim 1 wherein said AM/PM adjustment means is a preprogrammable PIN diode attenuator.

6. The apparatus according to claim 1 wherein said AM/PM adjustment means is a variable resistive attenuator.

* * * * *